United States Patent
Wu et al.

(10) Patent No.: US 11,733,598 B2
(45) Date of Patent: Aug. 22, 2023

(54) TUNABLE LIGHT PROJECTOR

(71) Applicant: LIQXTAL TECHNOLOGY INC., Tainan (TW)

(72) Inventors: Biing-Seng Wu, Tainan (TW); Hung-Shan Chen, Tainan (TW); Ming-Syuan Chen, Tainan (TW)

(73) Assignee: LIQXTAL TECHNOLOGY INC., Tainan (TW)

( * ) Notice: Subject to any disclaimer, the term of this patent is extended or adjusted under 35 U.S.C. 154(b) by 835 days.

(21) Appl. No.: 16/703,775

(22) Filed: Dec. 4, 2019

(65) Prior Publication Data

US 2021/0173291 A1  Jun. 10, 2021

(51) Int. Cl.
*G03B 21/20* (2006.01)
*H01S 5/40* (2006.01)
*H01S 5/183* (2006.01)

(52) U.S. Cl.
CPC .......... *G03B 21/2033* (2013.01); *H01S 5/183* (2013.01); *H01S 5/4031* (2013.01)

(58) Field of Classification Search
CPC .... G03B 21/2033; H01S 5/183; H01S 5/4031
See application file for complete search history.

(56) References Cited

U.S. PATENT DOCUMENTS

| | | | |
|---|---|---|---|
| 11,126,060 B2 * | 9/2021 | Chen | G01S 7/4814 |
| 2005/0046584 A1 | 3/2005 | Breed | |
| 2005/0207314 A1 * | 9/2005 | Wada | G11B 7/1369 |
| | | | 369/112.08 |
| 2010/0091354 A1 * | 4/2010 | Nam | G02B 30/27 |
| | | | 359/298 |
| 2013/0314649 A1 | 11/2013 | Choi et al. | |
| 2015/0271482 A1 * | 9/2015 | Chen | G02B 6/0043 |
| | | | 349/65 |
| 2018/0246354 A1 | 8/2018 | Popovich et al. | |
| 2019/0265497 A1 * | 8/2019 | Bai | G03B 21/208 |

OTHER PUBLICATIONS

"Office Action of Taiwan Counterpart Application", dated Jan. 28, 2021, p. 1-p. 10.

* cited by examiner

*Primary Examiner* — Jerry L Brooks
(74) *Attorney, Agent, or Firm* — JCIPRNET

(57) ABSTRACT

A tunable light projector including the following is provided. A light source is configured to emit a light beam. A fixed optical phase modulator is disposed on a path of the light beam and is configured to modulate phases of the light beam. A tunable liquid crystal panel is disposed on the path of the light beam and a partial region of the tunable liquid crystal panel is configured to electrically switch the light beam between a structured light and a flood light. A driver is configured to control the light source and control the tunable liquid crystal panel to switch the light beam between the structured light and the flood light. The tunable liquid crystal panel includes: a first substrate; a second substrate; a liquid crystal layer; a first electrode layer; and a second electrode layer.

19 Claims, 10 Drawing Sheets

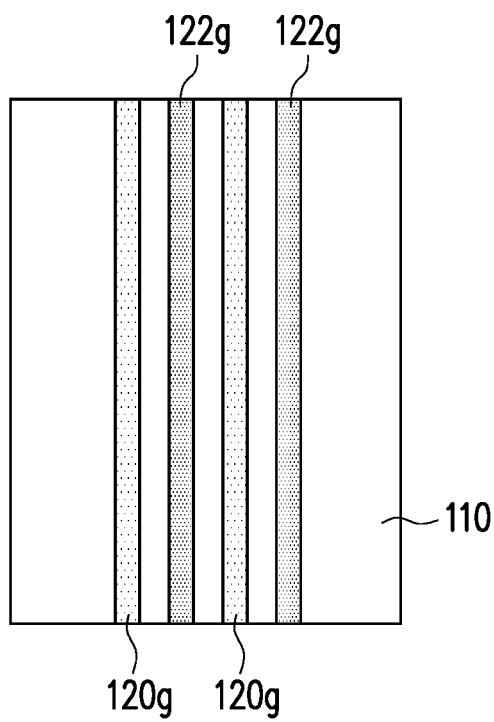
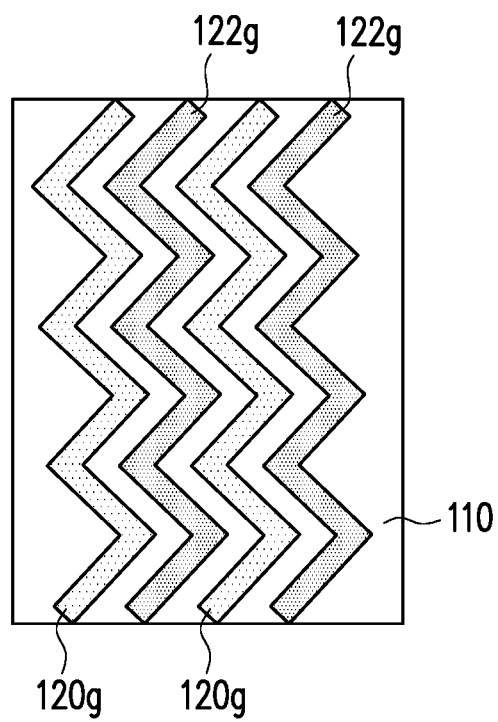
FIG. 4A  FIG. 4B
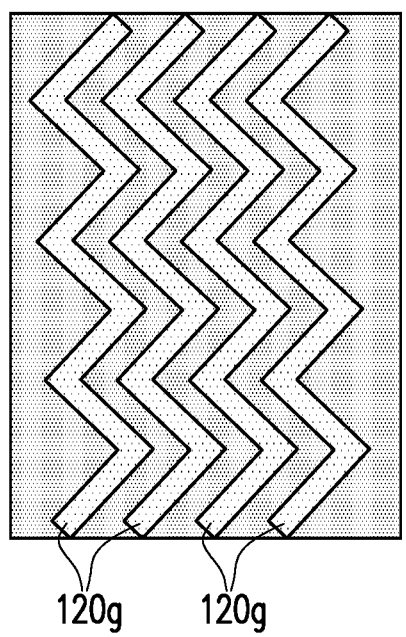
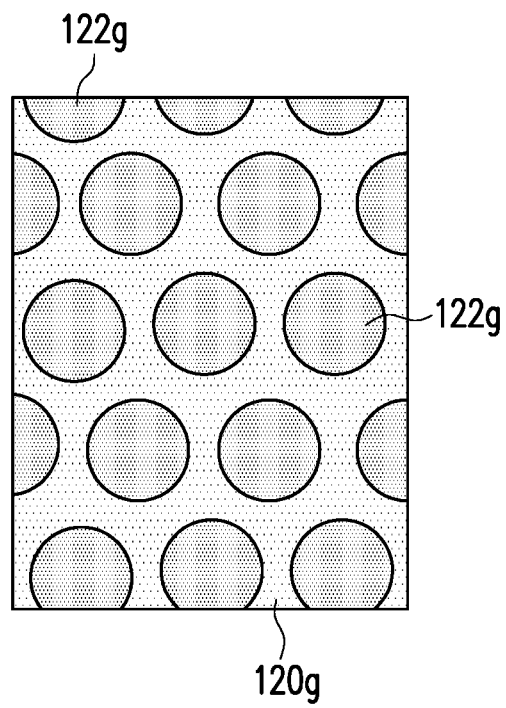
FIG. 4C  FIG. 4D

TUNABLE LIGHT PROJECTOR

BACKGROUND

Technical Field

The invention generally relates to a sensing device and a light projector, and, in particular, to an optical sensing device, a structured light projector, and a tunable light projector.

Description of Related Art

At present, the mainstream technology in the field of 3-dimension (3D) sensing is divided into time of flight (TOF) and structured illumination. The TOF technology uses pulsed laser and complementary metal-oxide-semiconductor (CMOS) sensor to calculate the distance based on a measured reflection time. Due to the structure and costs, TOF 3D sensing is generally more suitable for resolving objects at long distance. In structured illumination, infrared source projects IR light onto a diffractive optical element (DOE) to produce 2D diffraction patterns, while a sensor is used to collect the reflected light. The distance of an object in 3-dimension can then be calculated using triangulation method. Structured illumination is limited by having projection lens with fixed focal length, which limits the distance that a clear and focused diffraction pattern are able to form, ultimately limiting the distance of an object that is resolvable to be within a small range.

To solve the foregoing problem of structured illumination, adding apodized lens to the lens group in order to produce a multifocal system was proposed. However, such a method comes at the expense of light efficiency, 2D diffraction pattern points and resolution.

Moreover, in the 3D face recognition of a mobile device, both a flood light system and a structured light system are used to achieve 3D face recognition. The flood light system is first used to determine whether an approaching object is a human face. If the approaching object is a human face, the structured light system is then started and used to determine whether the detected human face is the face of a user of the mobile device. However, adopting two systems, i.e. the flood light system and the structured light system, in a mobile device may occupy large space and be costly.

SUMMARY

The invention provides a tunable light projector which uses a tunable liquid crystal panel to switch the light beam between a structured light and a flood light.

According to an embodiment of the invention, a tunable light projector is provided. The tunable light projector includes a light source configured to emit a light beam; a fixed optical phase modulator disposed on a path of the light beam and configured to modulate phases of the light beam; a tunable liquid crystal panel disposed on the path of the light beam and a partial region of the tunable liquid crystal panel is configured to electrically switch the light beam between a structured light and a flood light, the tunable liquid crystal panel comprising: a first substrate; a second substrate, wherein the first substrate is closer to the light source than the second substrate; a liquid crystal layer disposed between the first substrate and the second substrate; a first electrode layer; and a second electrode layer, wherein the first electrode layer and the second electrode are both disposed on one of the first substrate and the second substrate, or are respectively disposed on the first substrate and the second substrate; and a driver electrically connected to light source and the tunable liquid crystal panel and configured to control the light source and control the tunable liquid crystal panel to switch the light beam between the structured light and the flood light.

According to an embodiment of the invention, a tunable light detector is provided. The tunable light detector includes: a tunable light projector, comprising: a light source configured to emit a light beam; a fixed optical phase modulator disposed on a path of the light beam and configured to modulate phases of the light beam; a tunable liquid crystal panel disposed on the path of the light beam wherein a partial region of the tunable liquid crystal panel is configured to electrically switch the light beam between a structured light and a flood light, the tunable liquid crystal panel comprising: a first substrate; a second substrate, wherein the first substrate is closer to the light source than the second substrate; a liquid crystal layer disposed between the first substrate and the second substrate; a first electrode layer; and a second electrode layer, wherein the first electrode layer and the second electrode are both disposed on one of the first substrate and the second substrate, or are respectively disposed on the first substrate and the second substrate; and a driver electrically connected to the light source and the tunable liquid crystal panel and configured to control the light source and control the tunable liquid crystal panel to switch the light beam between the structured light and the flood light; and a sensor, detecting the reflected structure light or the reflected flood light emitted by the tunable light projector.

In the tunable light projector according to the embodiment of the invention, a partial region of a tunable liquid crystal panel is adopted to switch a light beam between a structured light and a flood light, so that the embodiment of the invention integrates the liquid crystal panel, a flood light system and a structured light system into a single system, which reduces the cost and the volume of an electronic device having structured light and flood light functions.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIGS. 4A-4D are schematic top views of the first electrode layer according to some embodiments in the invention.

DESCRIPTION OF THE EMBODIMENTS

Figure 1A:
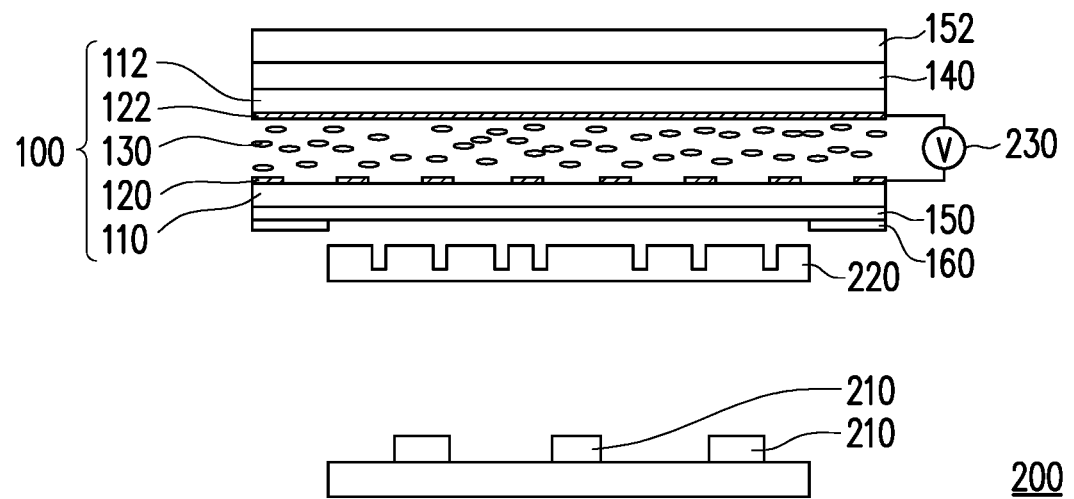
FIG. 1A is a schematic cross-sectional view of a tunable light projector according to some embodiments of the invention.

Reference will now be made in detail to the present preferred embodiments of the invention, examples of which are illustrated in the accompanying drawings. Wherever possible, the same reference numbers are used in the drawings and the description to refer to the same or like parts.

Further, spatially relative terms, such as "underlying", "below", "lower", "overlying", "upper", "top", "bottom", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic cross-sectional view of a tunable light projector. Referring to FIG. 1A, a tunable light projector 200 in this embodiment includes at least one light source 210 (a plurality of light sources 210 are exemplarily shown in FIG. 1A), a fixed optical phase modulator 220, a tunable liquid crystal panel 100, and a driver 230. The light sources 210 are configured to emit a plurality of light beams 211 (a light source 210 emitting a light beam 211 is exemplarily shown in FIG. 1A). In this embodiment, the light sources 210 are respectively a plurality of light-emitting regions (or light-emitting points) of a VCSEL, a plurality of edge-emitting lasers (EELs), or a plurality of other appropriate laser emitters or laser diodes. In some embodiments, the light sources 210 emits the infrared (IR) lights.

The fixed optical phase modulator 220 is disposed on a path of the light beam 211 and configured to modulate phases of the light beam 211. In this embodiment, the fixed optical phase modulator 220 is a diffractive optical element (DOE) or a micro lens array which modulates the light beam 211 to a structured light or a flood light.

The tunable liquid crystal panel 100 is disposed on the path of the light beam 211 from the fixed optical phase modulator 220 and configured to switch the light beam 211 between a structured light and a flood light. In some embodiments, the tunable liquid crystal panel 100 switches a structured light to a flood light. In some embodiments, the tunable liquid crystal panel 100 switches a flood light to a structured light.

The tunable liquid crystal panel 100 includes a first substrate 110, a second substrate 112, a liquid crystal layer 130, a first electrode layer 120 and a second electrode layer 122.

The liquid crystal layer 130 is disposed between the first substrate 110 and the second substrate 112, wherein the first substrate is at the side closer to the light source and the second substrate is at the side away from the light source. In this embodiment, the first substrate 110 and the second substrate 112 are transparent substrates, e.g. glass substrates or plastic substrates. The first electrode layer 120 and the second electrode layer 122 may be made of indium tin oxide (ITO), any other transparent conductive metal oxide, or any other transparent conductive material.

FIG. 1A shows that the first electrode layer 120 is a patterned layer. However, in other embodiments, the second electrode layer 122 may be an unpatterned layer, a patterned layer, or both the first electrode layer 120 and the second electrode layer 122 may be patterned layers. In some embodiments, at least one of the first electrode layer 120 and the second electrode layer 122 is a patterned layer. In some embodiments, both the first electrode layer 120 and the second electrode layer 122 are unpatterned layers.

The first electrode layer 120 and the second electrode 122 are both disposed on one of the first substrate 110 and the second substrate 112, or are respectively disposed on the first substrate 110 and the second substrate 112. The driver 230 is electrically connected to the light source 210 and the tunable liquid crystal panel 100. More specifically, the driver 230 is electrically connected to the first electrode layer 120 and the second electrode layer 122 and configured to change a voltage difference between the first electrode layer 120 and the second electrode layer 122, so as to switch the light beam 211 from the structured light to the flood light or from the flood light to the structured light. Specifically, the optical spatial phase distribution of the liquid crystal layer 130 is changed with the change of the voltage difference, so as to switch the light beam 211 between the structured light and the flood light.

The tunable liquid crystal panel 100 further comprises the color filter 140, the first polarizer 150, the second polarizer 152 and the backlight layer 160. The first polarizer 150 is between the first substrate 110 and the backlight layer 160. The color filter 140 is between the second substrate 112 and the second polarizer 152.

When the color filter 140 received the visible light emitted by the backlight layer 160, the color filter 140 filters the light to generate a plurality of colors such as red, green and blue. The first and second polarizers 150 and 152 are used to polarize the visible light generated by the backlight layer 160.

The backlight layer 160 does not cover a partial region of the tunable liquid crystal panel 100, wherein this partial region is above the tunable light projector 200 and the area of the partial region of the tunable liquid crystal panel 100 is substantially the same as the area of the tunable light projector 200. Therefore, the light beam emitted by the light source 210 is able to penetrate the tunable liquid crystal panel 100, without being blocked by the color filter 140, the first polarizer 150 and the second polarizer 152. In some embodiments, the color filter 140, the first polarizer 150 and the second polarizer 152 are infrared penetrable. Also, the metal wirings and the thin film transistor of the tunable liquid crystal panel 100 (not shown) also do not cover the partial region of the tunable liquid crystal panel 100, so the light beam emitted by the light source 210 is able to penetrate the tunable liquid crystal panel 100. In other words, the materials of tunable liquid crystal panel 100 in front of the tunable light projector is reduced as much as possible to enhance the structure light or the flood light emitted by the light source 210.

For the area other than the partial region of the tunable liquid crystal panel 100, it is used as a normal liquid crystal display.

In some embodiments, in order to switch the structure light to the flood light or to switch the flood light to the structure light, the orientations of the liquid crystal molecules in the partial region of the tunable liquid crystal panel 100 is different from the liquid crystal molecules of the rest of the tunable liquid crystal panel 100.

Figure 1B:
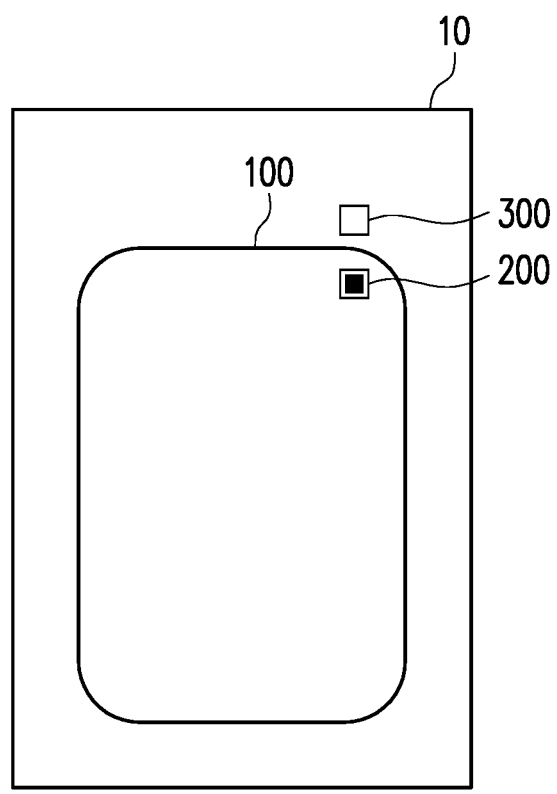
FIG. 1B is a schematic top view of a liquid crystal panel according to some embodiments of the invention.

FIG. 1B is a schematic top view of a liquid crystal panel according to some embodiments of the invention. The electronic device 10 includes the liquid crystal panel 100. The tunable light projector 200 is occupies a partial region of the liquid crystal panel 100. A sensor 300 is disposed near the tunable light projector 200 and is outside of the liquid crystal panel 100. When the tunable light projector 200 emits the structure light or the flood light to object to be detected, the sensor is used to detect the structure light or the flood light reflected by the object to be detected. The position of the sensor 300 is not limited thereto. In some embodiments, the sensor 300 may be within the liquid crystal panel 100.

Figure 2A:
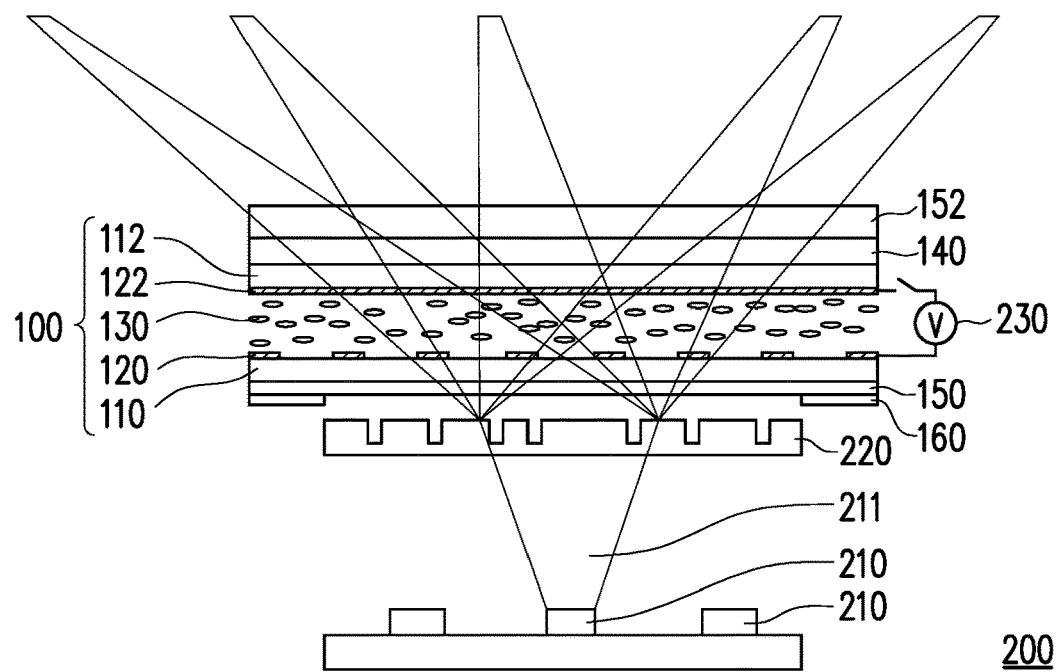
FIGS. 2A, 2B, 2C and 2D are schematic cross-sectional views of a tunable light projector respectively in a structured light mode and a flood light mode according to some embodiments of the invention.
Figure 2B:
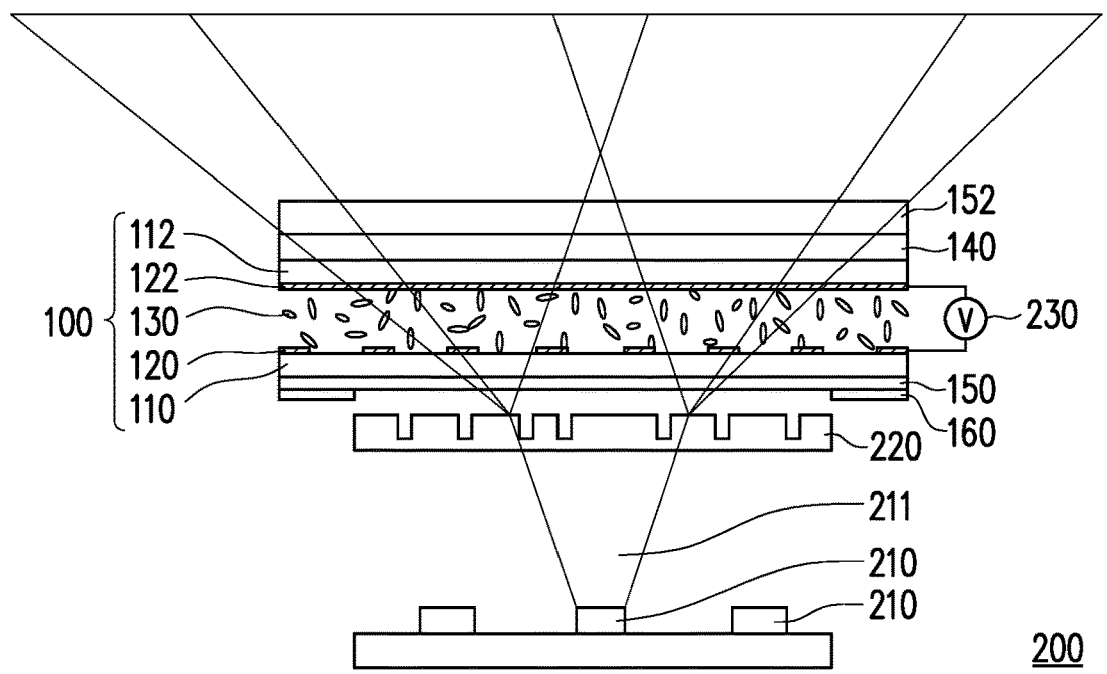
Figure 2C:
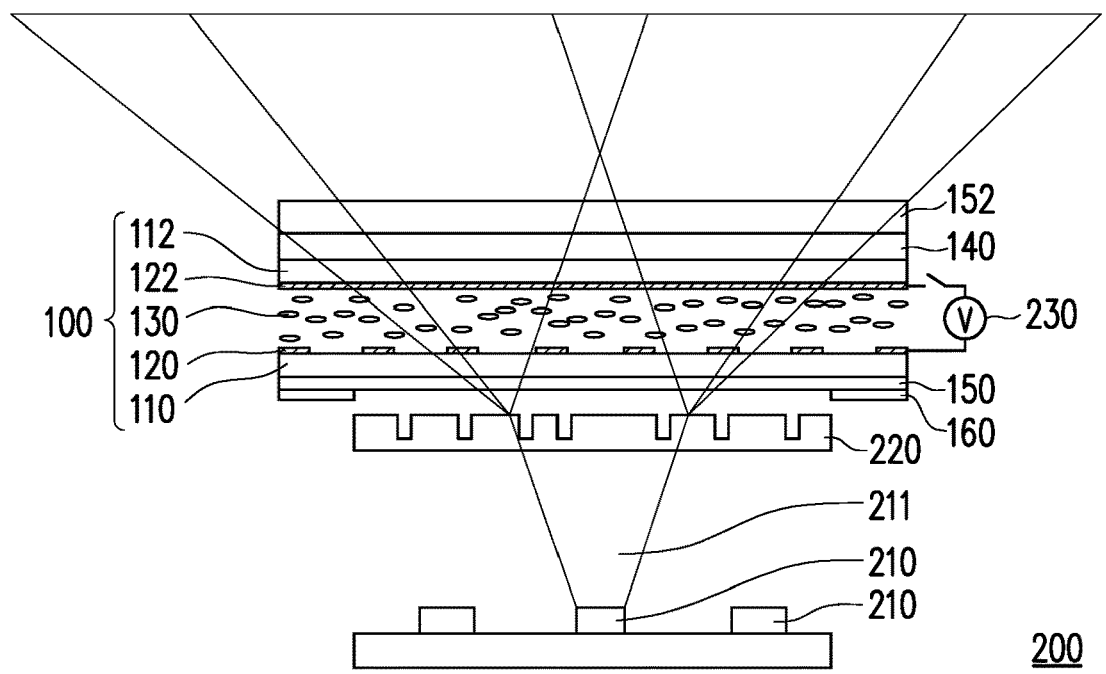

FIGS. 2A, 2B, 2C and 2D are schematic cross-sectional views of a tunable light projector respectively in a structured light mode and a flood light mode according to some embodiments of the invention. In some embodiments, the fixed optical phase modulator 220 is configured to modulate the light beam 211 to a structure light. In some embodiments, for example, in FIG. 2A, the voltage difference between the first electrode layer 120 and the second electrode layer 122 is about zero, and the refractive index distribution of the liquid crystal layer 130 is uniform, so that the liquid crystal layer 130 is like a transparent layer. As a result, the structured light from the fixed optical phase modulator 220 passes through the transparent layer and is still a structured light, and the tunable light projector 200 is in a structured light mode. In FIG. 2B, the voltage difference between the first electrode layer 120 and the second electrode layer 122 is not equal to zero, and the refractive index distribution of the liquid crystal layer 130 is not uniform, so that the liquid crystal layer 130 is like a lens array. As a result, the structured light from the fixed optical phase modulator 220 is converted to a flood light by the lens array, and the tunable light projector 100 is in a flood light mode. The structured light may irradiate an object and form a light pattern with dots, stripes, or any other suitable pattern on the object. The flood light may uniformly irradiate the object.

Figure 2D:
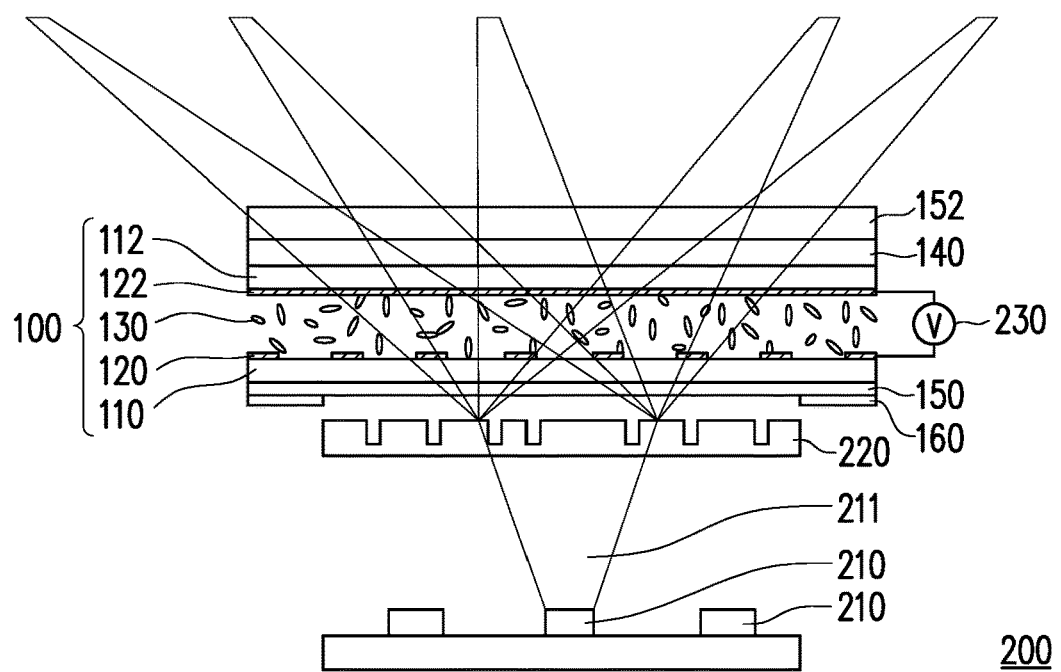

In some embodiments, the fixed optical phase modulator 220 is configured to modulate the light beam 211 to a flood light. In some embodiments, for example, in FIG. 2C, the voltage difference between the first electrode layer 120 and the second electrode layer 122 is about zero, and the refractive index distribution of the liquid crystal layer 130 is uniform, so that the liquid crystal layer 130 is like a transparent layer. As a result, the flood light from the fixed optical phase modulator 220 passes through the transparent layer and is still a flood light, and the tunable light projector 200 is in a flood light mode. In FIG. 2D, the voltage difference between the first electrode layer 120 and the second electrode layer 122 is not equal to zero, and the refractive index distribution of the liquid crystal layer 130 is not uniform, so that the liquid crystal layer 130 is like a lens array. As a result, the structured light from the fixed optical phase modulator 220 is converted to a structure light by the lens array, and the tunable light projector 100 is in a structure light mode.

In this embodiment, the tunable liquid crystal panel 100 is adopted to switch the light beam 211 from a structured light to a flood light or to switch the light beam 211 from a flood light to a structured light, so that this embodiment integrates a flood light system and a structured light system into a single system, which reduces the cost and the volume of an electronic device having structured light and flood light functions.

Figure 3A:
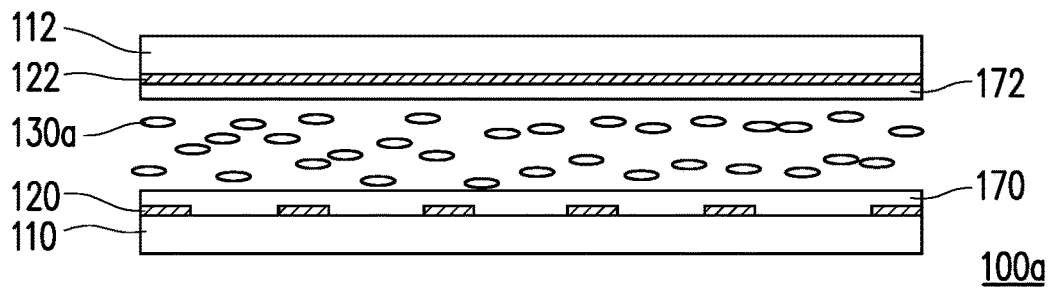
FIGS. 3A-3D are schematic cross-sectional views of a tunable liquid crystal panel according to some embodiments of the invention.

FIG. 3A is a schematic cross-sectional view of a tunable liquid crystal panel according to another embodiment of the invention. Referring to FIG. 3A, the tunable liquid crystal panel 100a is similar to the tunable liquid crystal panel 100 in FIG. 1A, and the main difference therebetween is as follows. In this embodiment, the tunable liquid crystal panel 100a further includes a first alignment layer 170 and a second alignment layer 172. The first alignment layer 170 is disposed between the first substrate 110 and the liquid crystal layer 130a, and the second alignment layer 172 is disposed between the second substrate 112 and the liquid crystal layer 130a. In this embodiment, the first alignment layer 170 is disposed between the first electrode layer 120 and the liquid crystal layer 130a, and the second alignment layer 172 is disposed between the second electrode layer 122 and the liquid crystal layer 130a. In this embodiment, the first alignment layer 170 and the second alignment layer 172 are anti-parallel alignment layers. In other words, the alignment direction of the first alignment layer 170 and the second alignment layer 172 are opposite from each other.

Figure 3B:
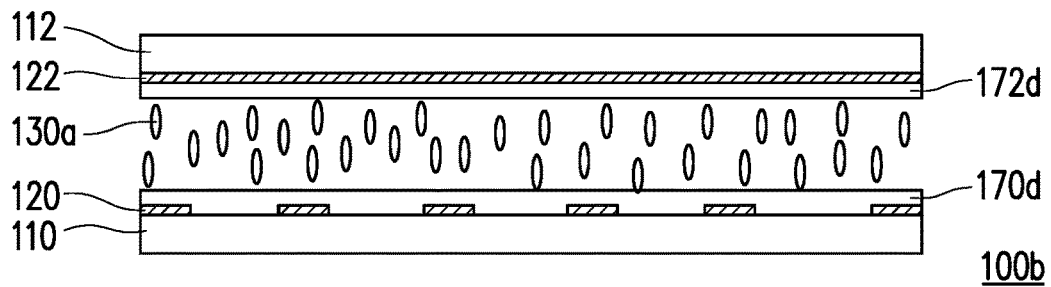

FIG. 3B is a schematic cross-sectional view of a tunable liquid crystal panel according to another embodiment of the invention. Referring to FIG. 3B, the tunable liquid crystal panel 100b is similar to the tunable liquid crystal panel 100a in FIG. 3A, and the main difference therebetween is as follows. In the tunable liquid crystal panel 100b according to this embodiment, the first alignment layer 170d and the second alignment layer 172d are vertical alignment layers.

Figure 3C:
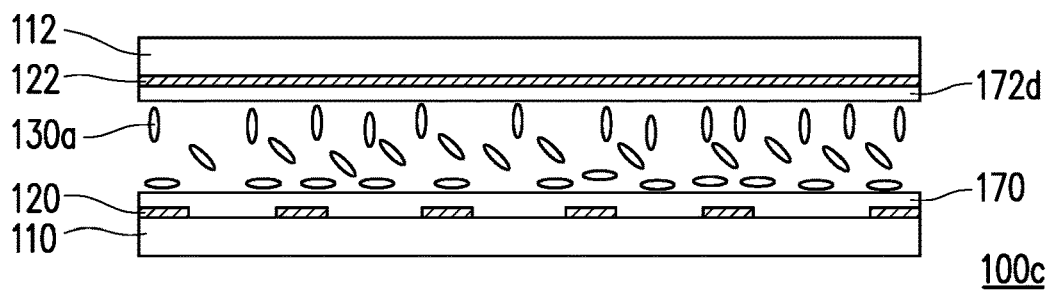

FIG. 3C is a schematic cross-sectional view of a tunable liquid crystal panel according to another embodiment of the invention. Referring to FIG. 3C, the tunable liquid crystal panel 100c is similar to the tunable liquid crystal panel 100a in FIG. 3A, and the main difference therebetween is as follows. In the tunable liquid crystal panel 100c according to this embodiment, the first alignment layer 170 and the second alignment layer 172d are a combination of a vertical alignment layer and a parallel alignment layer. For example, the first alignment layer 170 is a parallel alignment layer, and the second alignment layer 172d is a vertical alignment layer.

Figure 3D:
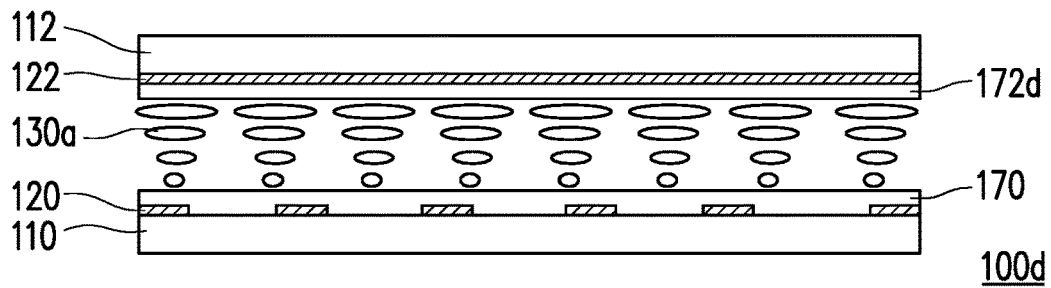

FIG. 3D is a schematic cross-sectional view of a tunable liquid crystal panel according to another embodiment of the invention. Referring to FIG. 3D, the tunable liquid crystal panel 100c is similar to the tunable liquid crystal panel 100a in FIG. 3A, and the main difference therebetween is as follows. In the tunable liquid crystal panel 100c according to this embodiment, the first alignment layer 170 and the second alignment layer 172d are parallel alignment layers and the alignment direction of the first alignment layer 170 and the alignment direction of the second alignment layer 172 are perpendicular to each other. In this embodiment, the first alignment layer 170 and the second alignment layer 172 are parallel alignment layers with their alignment perpendicular to each other.

With different alignment combination of the first alignment layer 170 and the second alignment layer 172, the liquid crystal molecules in the liquid crystal layer 130 can have different orientations, which generates different optical phases, when there is about zero voltage between the first electrode 120 and the second electrode 122.

FIGS. 4A-4D are schematic top views of the first electrode layer according to some embodiments in the invention.

In FIGS. 4A and 4B, the first electrode layer 120g and the second electrode layer 122g are both disposed on the same substrate, e.g. the first substrate 110, and are both patterned layers. The first electrode layer 120g and the second electrode layer 122g has an in-plane switch (IPS) electrode design. Specifically, the first electrode layer 120g includes a plurality of conductive micro-patterns 120g, and the second electrode layer 122g includes a plurality of conductive micro-patterns 122g. The conductive micro-patterns 120g and the conductive micro-patterns 122g are alternately arranged along a direction (e.g. the right direction in FIGS. 4A and 4B). The conductive micro-patterns 120g and the conductive micro-patterns 122g may have a straight shape as shown in FIG. 4A, which is also known as ITO slit design. In some embodiments, each of the conductive micro-patterns 120g and the conductive micro-patterns 122g may extend along a direction perpendicular to the paper surface of FIG. 4A. In some embodiments, the conductive micro-patterns 120g and the conductive micro-patterns 122g may have a zigzag shape as shown in FIG. 4B. In some embodiments, e.g. FIGS. 4A and 4B, the width of the electrodes or a pitch between the electrodes of the patterned ITO layers in the partial region of the tunable liquid crystal panel is different from the rest of the tunable liquid crystal panel. In some embodiments, e.g. FIGS. 4A and 4B, the width of the electrodes or a pitch between the electrodes of the patterned ITO layers in the partial region of the tunable liquid crystal panel is the same as the rest of the tunable liquid crystal panel.

In FIG. 4C, the first electrode layer 120g and the second electrode layer 122g have a fringe-field switch (FFS) electrode design. The second electrode layer 122g is a plane continuous layer between the first electrode layer 120g and the substrate 110, and the first electrode layer 120g and the second electrode layer 122 are insulated from each other by an insulating layer 110a disposed therebetween. The first electrode layer 120g in FIG. 4C is the same as the description of the first electrode layer 120g in FIG. 4A and FIG. 4B.

In FIG. 4D, the first electrode layer 120g has a hole patterned electrode design. The second electrode layer 122g is a plane continuous layer between the first electrode layer 120g and the substrate 110, and the first electrode layer 120g and the second electrode layer 122 are insulated from each other by an insulating layer 110a disposed therebetween. The first electrode layer 120g has a plurality of micro-openings, such as circles, as shown in FIG. 4D, which is also known as a hole pattern design.

With the first electrode layer 120 and the second electrode layer 122 being patterned, when the voltage between the first electrode layer 120 and the second electrode layer 122 is not zero, the liquid crystal molecules in the liquid crystal layer 130 will be arranged according to the electric field between the first electrode layer 120 and the second electrode layer 122. Therefore, the refractive index distribution of the liquid crystal layer 130 is non-uniform, which may diffract the light into a desired pattern.

Figure 5A:
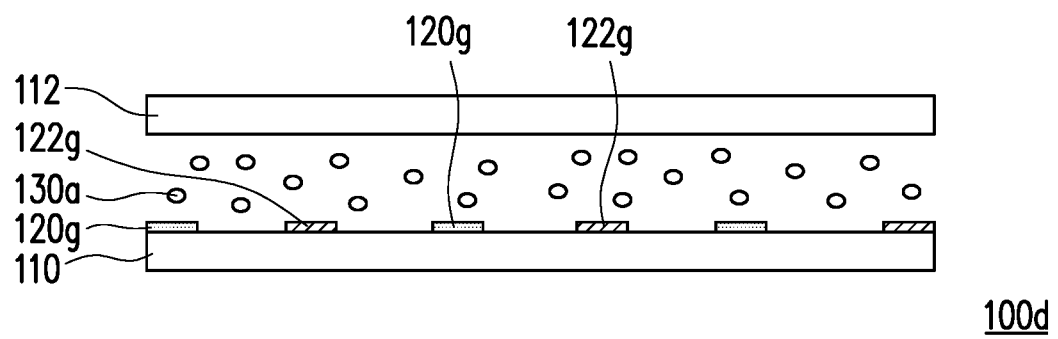
FIGS. 5A and 5B are schematic cross-sectional views of a tunable liquid crystal panel according to some embodiments of the invention.

FIG. 5A is a schematic cross-sectional views of a tunable liquid crystal panel according to some embodiment of the invention, such as FIGS. 4A and 4B. Referring to FIG. 5A, the tunable liquid crystal panel 100d in this embodiment is similar to the tunable liquid crystal panel 100a in FIG. 3A, and the main difference therebetween is as follows. In the tunable liquid crystal panel 100d according to this embodiment, the first electrode layer 120g and the second electrode layer 122g are both disposed on the same substrate, e.g. the first substrate 110, and are both patterned layers. The first electrode layer 120g and the second electrode layer 122g has an in-plane switch (IPS) electrode design. Specifically, the first electrode layer 120g includes a plurality of conductive micro-patterns 120g, and the second electrode layer 122g includes a plurality of conductive micro-patterns 122g. The conductive micro-patterns 120g and the conductive micro-patterns 122g are alternately arranged along a direction (e.g. the right direction in FIG. 5A).

Figure 5B:
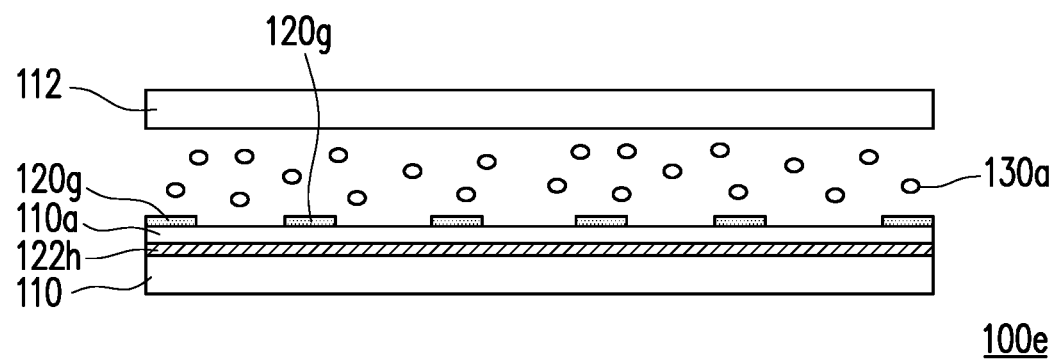

FIG. 5B is a schematic cross-sectional view of a tunable liquid crystal panel according to another embodiment of the invention, such as FIGS. 4C and 4D. The tunable liquid crystal panel 100e in this embodiment is similar to the tunable liquid crystal panel 100d in FIG. 5A, and the main difference therebetween is as follows. In the tunable liquid crystal panel 100e according to this embodiment, the first electrode layer 120g and the second electrode layer 122h have a fringe-field switch (FFS) electrode design. The second electrode layer 122g is a plane continuous layer between the first electrode layer 120g and the substrate 910, and the first electrode layer 120g and the second electrode layer 122g are insulated from each other by an insulating layer 100a disposed therebetween. The first electrode layer 120g in FIG. 5B is the same as the description of the first electrode layer 120g in FIG. 5A.

Figure 6A:
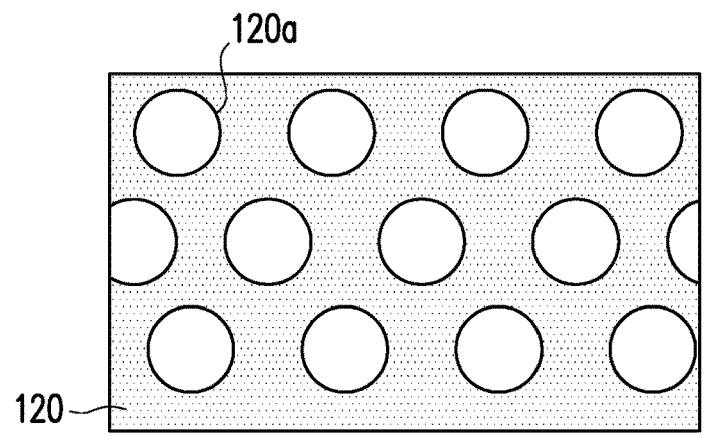
FIGS. 6A-6C are schematic top views of some different variations of the first electrode layer in FIG. 4D.
Figure 6B:
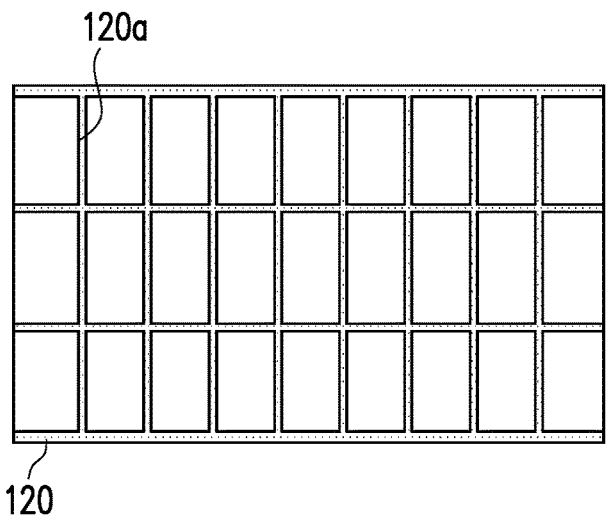
Figure 6C:
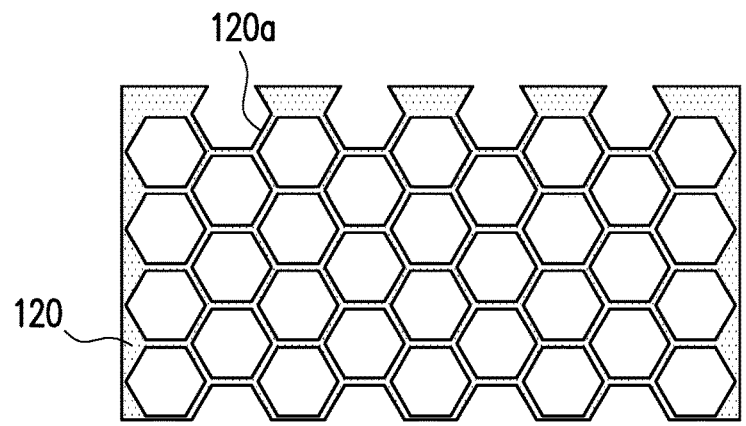

FIGS. 6A-6C are schematic top views of some different variations of the first electrode layer in FIG. 4D and FIG. 5B respectively according to three embodiments in the invention. Referring to FIG. 6A, FIG. 6B, and FIG. 6C, the patterned layer (e.g. the first electrode layer 120 and the figures show the first electrode layer 120 as examples) has a plurality of micro-openings 120a having a maximum diameter of the opening less than 1 millimeter. The shapes of the micro-openings 120a includes circles (as shown in FIG. 6A), rectangles (as shown in FIG. 6B), squares, hexagons (as shown in FIG. 6C), other regular shapes, other irregular shapes, or a combination thereof.

Figure 7A:
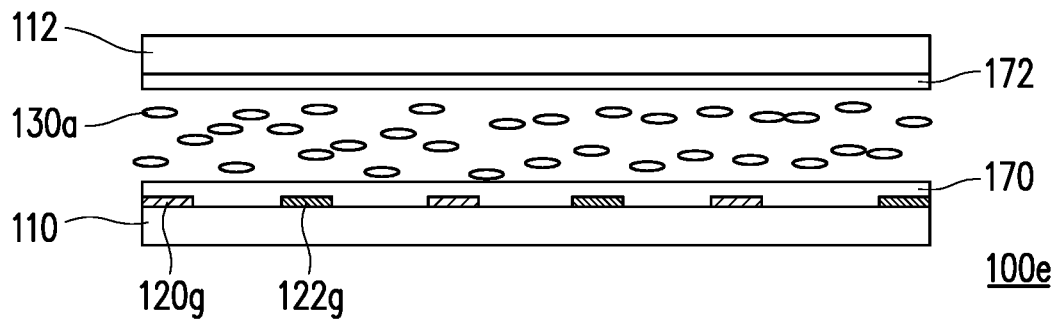
FIGS. 7A-7D are schematic cross-sectional views of a tunable liquid crystal panel according to some embodiments of the invention.

FIGS. 7A-7D are schematic cross-sectional views of a tunable liquid crystal panel according to some embodiments of the invention. Referring to FIG. 7A, the tunable liquid crystal panel 100e is similar to the tunable liquid crystal panel 100a in FIG. 3A, and the main difference therebetween is as follows. In this embodiment, the tunable liquid crystal panel 100e has the first electrode 120g on the first substrate 110, and the second electrode 122g also on the first substrate 110. In some embodiment, the tunable liquid crystal panel 100e has both the first electrode 120g and the second electrode 122g on the second substrate 112. Since the first electrode 120g and the second electrode 122g are both on the first substrate 110, which is the same side of the tunable liquid crystal panel 100e, the first electrode 120g and the second electrode 122g may form an in-plane switch (IPS) electrode design, which are arranged in a pattern similar to FIG. 4A or FIG. 4B. In this IPS design, that the first electrode 120g and the second electrode 122g form two conductive micro-patterns, which are driven by two different voltages separately. As a result, the electric field generated by the first electrode 120g and the second electrode 122g will not be uniform within the tunable liquid crystal panel 100e.

Figure 7B:
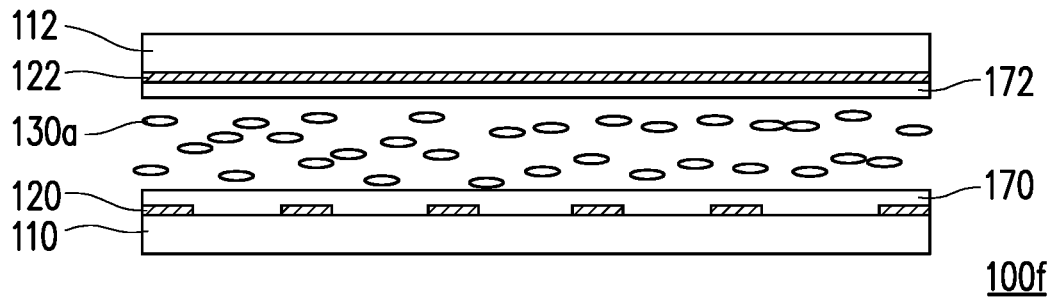

Referring to FIG. 7B, the tunable liquid crystal panel 100f is similar to the tunable liquid crystal panel 100a in FIG. 3A, and the main difference therebetween is as follows. In this embodiment, the tunable liquid crystal panel 100f has both the first electrode 120 and the second electrode 122. The first electrode 120 is a patterned electrode while the second electrode 122 is an unpatterned electrode. In some embodiments, the first electrode 120 is an unpatterned electrode while the second electrode 122 is a patterned electrode.

Figure 7C:
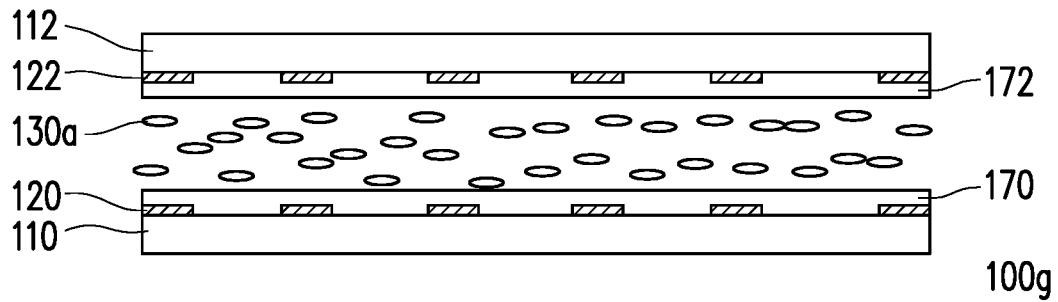

Referring to FIG. 7C, the tunable liquid crystal panel 100g is similar to the tunable liquid crystal panel 100a in FIG. 3A, and the main difference therebetween is as follows. In this embodiment, the tunable liquid crystal panel 100g has both the first electrode 120 and the second electrode 122, and both the first electrode 120 and the second electrode 122 are patterned electrode.

Figure 7D:
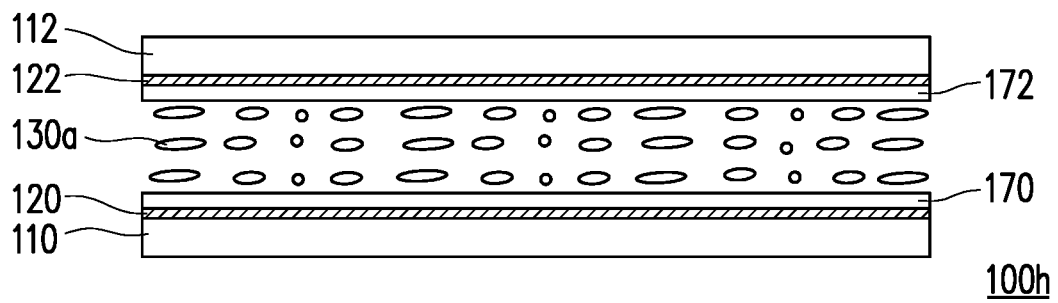

Referring to FIG. 7D, the tunable liquid crystal panel 100h is similar to the tunable liquid crystal panel 100a in FIG. 3A, and the main difference therebetween is as follows. In this embodiment, the tunable liquid crystal panel 100h has both the first electrode 120 and the second electrode 122, and both the first electrode 120 and the second electrode 122 are unpatterned electrode.

Figure 8A:
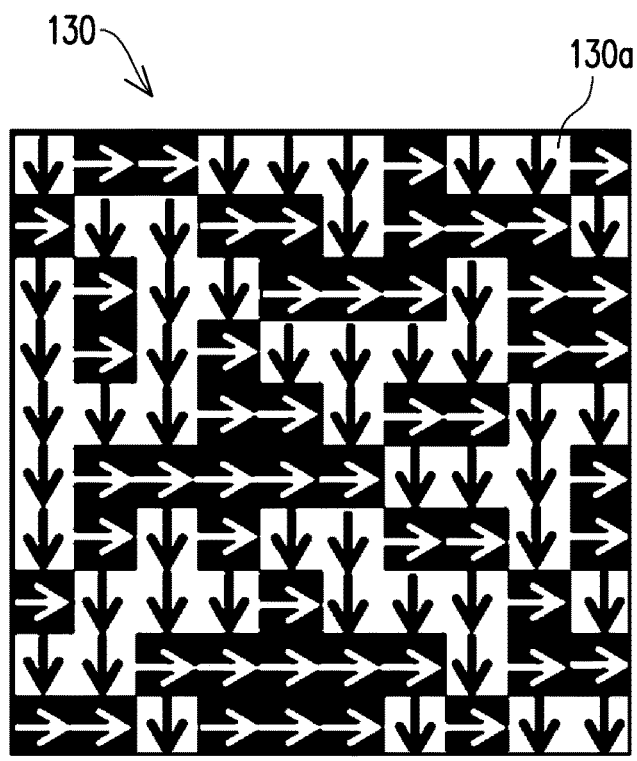
FIGS. 8A and 8B are schematic top views of a liquid crystal layer according to some embodiments of the invention.
Figure 8B:
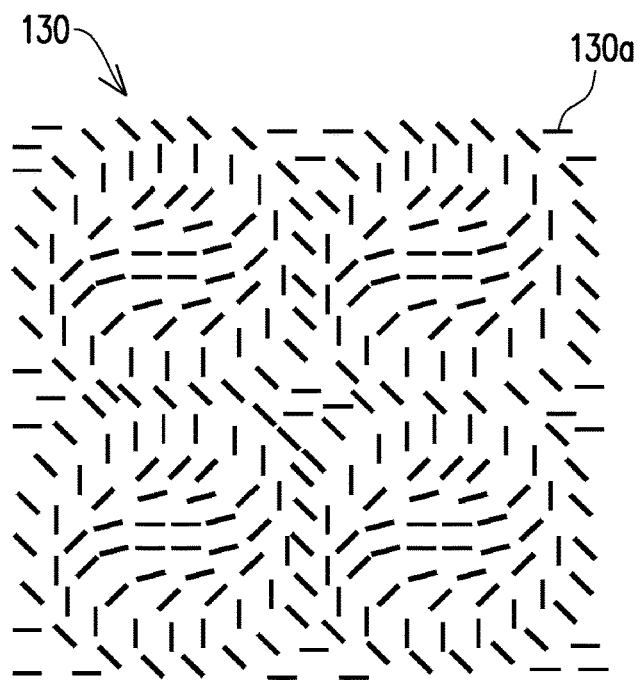

FIGS. 8A and 8B are schematic top views of a liquid crystal layer according to some embodiments of the invention. FIG. 8A and FIG. 8B are schematic diagram of a liquid crystal layer 130 from a top view, i.e. along z-direction, according to an embodiment of the invention. In some embodiments, e.g. FIG. 7D, both the first electrode 120 and the second electrode 122 are unpatterned electrode. However, the liquid crystal molecules 130a of the liquid crystal layer 130 may be arranged in a pre-determined pattern, as shown in FIGS. 8A and 8B, due to the alignment layers 170 and 172. When there is no voltage difference between the first electrode 110 and the second electrode 112, the liquid crystal molecules 130a are laying in a pre-determined pattern according to alignment layers 170 and 172. When the voltage difference between the first electrode 110 and the second electrode 112 is not equal to zero, the liquid crystal molecules 130a are aligned in a vertical direction. And the light 211 emitted from the light source 210 may be switched from a structure light to a flood light from a flood light to a structure light.

In FIG. 8A, the liquid crystal molecules 130a are controlled by the alignment layers 170 and 172 to form a diffractive optical element with liquid crystal molecules aligned in two orientations. Other diffractive optical elements may be formed by having alignment layers with different surface pattern and the invention is not limited thereto.

In FIG. 8B, the polar angle of liquid crystal molecules is controlled by the alignment layers 170 and 172 to form the Pancharatnam-Berry phase liquid crystal lens. Other liquid crystal lens may be formed by having alignment layers with different surface pattern and the invention is not limited thereto.

Figure 9:
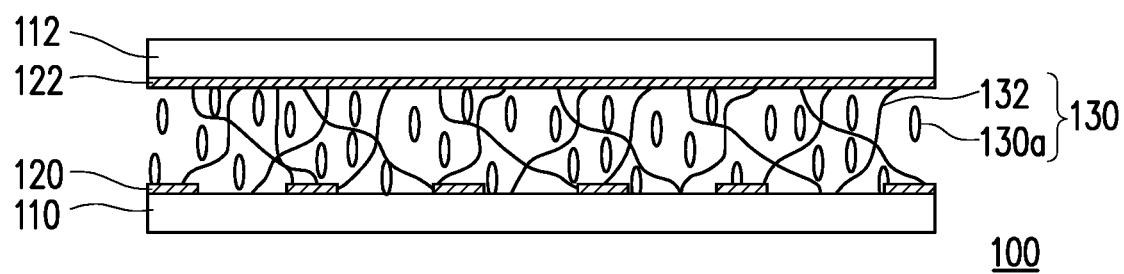
FIG. 9 is a schematic cross-sectional view of the tunable liquid crystal panel according to some embodiments.

FIG. 9 is a schematic cross-sectional view of the tunable liquid crystal panel according to some embodiments. Referring to FIG. 9, the tunable liquid crystal panel 100 has the liquid crystal layer 130 including polymer network liquid crystals (PNLCs), which includes liquid crystal molecules 130a with a polymer network 132.

When the voltage between the first electrode 110 and the second electrode 112 is about zero, the liquid crystal molecules 130a in the liquid crystal layer are aligned vertically, so the refractive index distribution of the liquid crystal layer 130 is uniform, so that the liquid crystal layer 130 is like a transparent layer. As a result, the structure light passes the liquid crystal layer is still a structure light, and the tunable liquid crystal panel is in a structure light mode.

When the voltage between the first electrode 110 and the second electrode 112 is not zero, the liquid crystal molecules 130a orientated along the direction of the electric field between the first electrode 110 and the second electric field 112. However, due to the presence of the polymer network 132, the orientation of the liquid crystal molecules 130a are randomly oriented in the liquid crystal layer. As a result, the refractive index distribution of the liquid crystal layer 130 is non-uniform. As a result, the structure light passes through the liquid crystal layer 130 becomes a flood light, and the tunable liquid crystal panel is in a flood light mode.

In conclusion, in the tunable light projector according to the embodiment of the invention, a tunable liquid crystal panel is adopted to switch a light beam between a structured light and a flood light, so that the embodiment of the invention integrates a flood light system and a structured light system into a single system, which reduces the cost and the volume of an electronic device having structured light and flood light functions. Each of the aforementioned tunable light projectors may replace any one of the aforementioned structured light projectors in the optical sensing device to form an optical sensing device having both a flood light recognition function and a structured light recognition function. In the flood light recognition function, the sensor may sense the object and determine whether the object is a human face. In the structured light recognition function, the sensor may sense the light pattern on the object and determine whether the detected human face is the face of a user of an electronic device.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A tunable light projector comprising:
a light source configured to emit a light beam;
a fixed optical phase modulator disposed on a path of the light beam and configured to modulate phases of the light beam;
a tunable liquid crystal panel disposed on the path of the light beam wherein a partial region of the tunable liquid crystal panel is configured to electrically switch the light beam between a structured light and a flood light, the tunable liquid crystal panel comprising:
a first substrate;
a second substrate, wherein the first substrate is closer to the light source than the second substrate;
a liquid crystal layer disposed between the first substrate and the second substrate;
a first electrode layer; and
a second electrode layer, wherein the first electrode layer and the second electrode are both disposed on one of the first substrate and the second substrate, or are respectively disposed on the first substrate and the second substrate; and
a driver electrically connected to the light source and the tunable liquid crystal panel and configured to control the light source and control the tunable liquid crystal panel to switch the light beam between the structured light and the flood light,
wherein the liquid crystal molecules in the partial region of the tunable liquid crystal panel forms a diffractive optical element.

2. The tunable light projector according to claim 1, wherein the light source is an infrared light source.

3. The tunable light projector according to claim 1, wherein the light source is a LED or a laser.

4. The tunable light projector according to claim 1, wherein the fixed optical phase modulator is a diffractive optical element or micro lens arrays.

5. The tunable light projector according to claim 1, wherein the fixed optical phase modulator is configured to modulate the light beam to a structured light or to a flood light.

6. The tunable light projector according to claim 1, further comprising a backlight layer between the tunable liquid crystal panel and the fixed optical phase modulator, wherein the backlight layer does not cover the partial region of the tunable liquid crystal panel.

7. The tunable light projector according to claim 1, wherein the tunable liquid crystal panel further comprise a polarizer and a filter, wherein the polarizer and the filter are infrared penetrable.

8. The tunable light projector according to claim 1, wherein the driver controls the tunable liquid crystal panel to switch the structured light to the flood light or switches the flood light to the structured light.

9. The tunable light projector according to claim 1, wherein the liquid crystal panel further comprises:
- a first alignment layer disposed between the first substrate and the liquid crystal layer; and
- a second alignment layer disposed between the second substrate and the liquid crystal layer.

10. The tunable light projector according to claim 9, wherein the first alignment layer and the second alignment layer are vertical alignment layers, parallel alignment layers, antiparallel alignment layers or a combination thereof.

11. The tunable light projector according to claim 1, wherein the liquid crystal panel further comprising a thin film transistor between the liquid crystal layer and the first electrode layer, wherein the thin film transistor does not cover the partial region of the tunable liquid crystal panel.

12. The tunable light projector according to claim 1, wherein at least one of the first electrode layer and the second electrode layer is a patterned ITO electrode.

13. The tunable light projector according to claim 1, wherein the first electrode layer and the second electrode layer are unpatterned ITO electrodes.

14. The tunable light projector according to claim 1, wherein the first electrode layer and the second electrode layer have an in-plane switch, fringe-field switch electrode, ITO slit or hole pattern design.

15. The tunable light projector according to claim 14, wherein a width of the electrodes or a pitch between the electrodes of patterned ITO layers in the partial region of the tunable liquid crystal panel is different from the rest of the tunable liquid crystal panel.

16. The tunable light projector according to claim 15, wherein shapes of the hole pattern electrodes comprises circles, rectangles, squares, hexagons, or a combination thereof.

17. The tunable light projector according to claim 1, wherein an orientation of liquid crystals in the partial region of the tunable liquid crystal panel is different from an orientation of liquid crystals in the rest of the tunable liquid crystal panel.

18. The tunable light projector according to claim 1, wherein the liquid crystal layer comprises nematic liquid crystals, polymer dispersed liquid crystals, or polymer network liquid crystals.

19. A tunable light detector, comprising:
- a tunable light projector, comprising:
  - a light source configured to emit a light beam;
  - a fixed optical phase modulator disposed on a path of the light beam and configured to modulate phases of the light beam;
  - a tunable liquid crystal panel disposed on the path of the light beam wherein a partial region of the tunable liquid crystal panel is configured to electrically switch the light beam between a structured light and a flood light, the tunable liquid crystal panel comprising:
    - a first substrate;
    - a second substrate, wherein the first substrate is closer to the light source than the second substrate;
    - a liquid crystal layer disposed between the first substrate and the second substrate;
    - a first electrode layer; and
    - a second electrode layer, wherein the first electrode layer and the second electrode are both disposed on one of the first substrate and the second substrate, or are respectively disposed on the first substrate and the second substrate; and
  - a driver electrically connected to the light source and the tunable liquid crystal panel and configured to control the light source and control the tunable liquid crystal panel to switch the light beam between the structured light and the flood light; and
- a sensor, detecting the reflected structure light or the reflected flood light emitted by the tunable light projector,
wherein the liquid crystal molecules in the partial region of the tunable liquid crystal panel forms a diffractive optical element.

* * * * *